United States Patent [19]

Grudkowski et al.

[11] 4,247,903

[45] Jan. 27, 1981

[54] MONOLITHIC ISOLATED GATE FET SAW SIGNAL PROCESSOR

[75] Inventors: Thomas W. Grudkowski, Glastonbury, Conn.; Thomas M. Reeder, Portland, Oreg.

[73] Assignee: United Technologies Corporation, Hartford, Conn.

[21] Appl. No.: 1,628

[22] Filed: Jan. 8, 1979

[51] Int. Cl.³ .................... G06G 7/195; H01L 41/08

[52] U.S. Cl. .................................. 364/821; 333/150; 333/193; 364/861

[58] Field of Search ............... 364/821, 862, 604, 861; 357/26; 333/150, 193-196

[56] References Cited

U.S. PATENT DOCUMENTS

| | | | |
|---|---|---|---|
| 3,801,883 | 4/1974 | Tiemann | 364/604 |
| 3,925,653 | 12/1975 | Otto | 364/861 |
| 3,935,564 | 1/1976 | Quate et al. | 357/26 |
| 4,016,514 | 4/1977 | Reeder et al. | 333/150 |
| 4,037,174 | 7/1977 | Moore et al. | 364/821 |
| 4,065,736 | 12/1977 | London | 357/26 |
| 4,066,984 | 1/1978 | Stern et al. | 364/862 |
| 4,128,615 | 12/1978 | Tournois et al. | 357/26 |
| 4,158,807 | 6/1979 | Senturia | 357/26 |

*Primary Examiner*—Felix D. Gruber

*Attorney, Agent, or Firm*—M. P. Williams

[57] ABSTRACT

A monolithic surface acoustic wave (SAW) signal processor which combines the functions of acoustic wave interaction, nonlinear product mixing, and integration, together with rapid-scan readout capability, which may be used, for instance, in correlation of amplitude and/or phase coded signals of a duration order of magnitude larger than the total propagation delay time of the SAW device, includes launching transducers at opposite ends of an interaction region, and a plurality of interaction taps, each tap comprising a Schottky barrier field effect transistor (FET), the sources and drains of the FETs being connected in common, but each FET gate being isolated. For long code correlation of a phase shift keyed signal, a reference wave having the same carrier frequency and identical coding is launched contemporaneously therewith in a first, correlation step, a standing wave component of product mixing of the two waves being of like sign or sense at any tap where the two waves are properly in phase integrating over the total number of code chips of the waves to provide an integrated, stored charge manifestation of correlation on the isolated gate of the related tap, the taps being interrogated for an integrated indication of correlation at one of the taps by means of a pulse of width the same as the propagation delay of a single tap mixing with an extended carrier at each tap, a component of product mixing at a third frequency (sum or difference) as a consequence of enhanced mixer efficiency due to the stored charge at the correlating tap, providing an output indication of the fact of correlation and phase relationship between the two waves. Various surface acoustic wave transducer and tap structures, utilizations, and implementation techniques are discussed.

2 Claims, 3 Drawing Figures

MONOLITHIC ISOLATED GATE FET SAW SIGNAL PROCESSOR

BACKGROUND OF THE INVENTION

1. Field of Art

This invention relates to surface acoustic wave signal processors, and more particularly to a monolithic surface acoustic wave module having isolated gate Schottky barrier taps thereon.

2. Description of the Prior Art

It has long been known that correlation of frequency modulated and/or phase shift keyed (such as bi-phase) signals, for signature verification, signal to noise improvement, and/or ranging, may be performed in a variety of ways. Signals of any temporal extent may be compared for correlation by multiplication in a product mixer and integration of the output, as in the common, standard, spread spectrum demodulator. However, correlation is achieved only when the two signals are perfectly synchronized within one code chip, which requires an indeterminate number of shifts in relative timing (in increments related to the code chip duration) of a reference signal to find the proper timing for correlation with the intelligence. In real time operations, such as target signature determination and/or detailed ranging in radar, it may be utterly impossible to acquire synchronization in a requisite time frame.

Another known form of correlation is performed in space by means of surface acoustic waves (SAWs). This may be achieved in the well known diode/SAW correlator of the type described in the commonly owned U.S. Pat. No. 4,016,514 to Reeder and Gilden. In such cases, a single correlation, of signal components distributed across all of the taps of a SAW delay line, is performed at one point in time. A convolver which will provide correlation if the reference signal is time inverted, utilizing a meandering-gate, single field effect transducer formed directly on a saw substrate, is disclosed in Spiermann, A.O.W., "Acoustic-Surface-Wave Convolver on Epitaxial Gallium Arsenide", Electronics Letters, Vol. 11, Nos. 25/26, December, 1975, pp. 614, 615. However, spatial correlators of these similar types are limited to processing of signals having a length (temporal extent) equal to the acoustical length (or propagation delay) of the processing device. And, the two waves must achieve code chip synchronization within the propagation delay of the device.

To overcome the shortcomings of time and space correlators, recent innovations have attempted to provide a plurality of contemporaneous temporal correlations, each phased slightly different from the other, so as to be able to handle long codes while at the same time providing a finite limit on the task of synchronization between the reference and the signal. One such device employs nonlinear interaction, between a surface acoustic wave and taps thereof along the interaction region, which product-mixes two waves launched from opposite ends of a surface acoustic wave device. Then, external integration and some form of correlation detection is provided. One such device is described in Menager and Desormiere, "Surface Acoustic Wave Tapped Correlator Using Time Integration", Applied Physics Letters, Vol. 27, No. 1, July 1, 1975, pp. 1, 2. However, as pointed out by Darby and Maines, "Tapped Delay Line Active Correlator: A Neglected Saw Device", IEEE 1975 Ultrasonics Symposium Proceedings, pp. 193–196, there is a great deal of difficulty in providing a circuitry having a component packing density which is commensurate with such a new device. Further, such devices are necessarily hybrid in nature, and therefore subject to mechanical and temperature problems.

The correlation, product mixing and integrating functions of an integrating correlator are combined in a gap-coupled, Schottky diode/lithium niobate integrating correlator structure, disclosed by Ralston et al, "A New Signal-Processing Device, The Integrating Correlator", IEEE 1977 Ultrasonic Symposium Proceedings, pp. 623–628. In this device, platinum/silicon diodes are formed on the surface of a lithium niobate substrate, and a silicon layer, separated from the diodes by an air gap of several thousand angstroms, provides the nonlinearity for product mixing, the integration being performed in the diodes. This apparatus has the distinct disadvantage of trying to maintain the critical air gap; it also requires precharging of the diodes and separate interdigital transducers for signal processing and readout. However, spurious signals, filling, and gain/bandwidth limitations are reported for such a device. A partial improvement, thereover, in a monolithic structure, is described by Tuan, H.C., et al, "A New Zinc-Oxide-On-Silicon Monolithic Storage Correlator", IEEE 1977 Ultrasonic Symposium Proceedings, pp. 496–499. This device provides p+ diffused diodes in an n-type silicon substrate with a zinc oxide overlayer having gold interdigital electroacoustic transducers thereon. However, this device is reported to have critical biasing problems, excessive spurious signals and limited dynamic range of on the order of 25–35 dB. In all of these devices, spreading due to dispersion inherent in dissimilarly-layered devices reduces the accuracy of timing the correlation peak.

It is apparent that in many applications, a monolithic structure, with its attendant mechanical integrity and temperature compatibility is to be desired. Furthermore, the advantage of the multi-correlation process of integrating saw correlators is increased as the number of taps becomes extremely high (hundreds or more), requiring a large number of complete channels of circuitry in monolithic form. Further, maximum utilization of such devices, particularly in real time applications, require the fastest, simplest process of use; that is, with a minimal number of steps and delays in the process of use.

SUMMARY OF THE INVENTION

Objects of the invention include provision of a monolithic saw signal processor, capable, for instance, of real time signal correlation of long codes, having improved operating characteristics, simplified structure and a minimal number of required signal processing steps.

According to the present invention, a surface acoustic wave (SAW) signal processing module comprises a structure having semiconductive and acoustoelectric properties provided with acoustoelectric launching transducers and a plurality of interaction taps, each tap comprising an insulated gate field effect transistor of which the gate is isolated.

In further accord with the present invention, the SAW signal processor module of the invention is employed as a long, phase and/or amplitude coded signal processor by interaction of the coded signal with a signal of like frequency and code at all of the taps of the processor, a standing wave component of product mixing thereof providing additive elements of DC electric field at any tap at which the signal and reference codes are synchronized with each other, the taps being thereafter interrogated by a pulse mixing with a carrier wave at two different frequencies, a product mixing result at a third frequency being dependent upon the field related to charge stored at the correlating tap, to provide an output, the presence of which is an indication of correlation, and the timing of which is an indication of the relative timing of the signal with respect to the reference. In still further accord with the present invention, the SAW processing module of the invention may be used for other types of signal processing employing correlative type interrogation of AM, FM or phase modulated signals.

The invention provides signal correlation of coded waves of any duration up to the reasonable storage time capacity of the module of the present invention, which may be on the order of tens of milliseconds. The invention provides rapid, real-time long code correlation of coded signals with substantially instantaneous, readout, including an indication of the relative timing of the reference and the signal.

The insulated gate field effect transistors may be formed on the surface of a semiconductive epitaxial layer of a semi-insulating gallium arsenide substrate, which provides both the semiconductive and acoustoelectric properties. The gate may be a Schottky barrier or a conventional p-n junction. The invention may be practiced with or without acoustic launch-enhancing layers of a highly acoustoelectric material, such as ZnO. The field effect transistors may alternatively be formed on a structure of composite materials which separately provide the necessary semiconductive and acoustoelectric properties, such as a zinc oxide layer on a silicon substrate, the source and drain of the field effect transistors being formed on opposite surfaces of the zinc oxide layer from the gate.

The present invention provides an integrating saw signal processor which is truly monolithic, formable with low cost, batch processing technology, and has the capacity for manufacture with an extremely large number of taps (hundreds or more). Although it requires no tap-associated external signal processing circuitry, it is capable of use with monolithic circuitry disposed about the periphery thereof, in the semiconductive material. It has high resolution, low noise, highly uniform interaction efficiency, low SAW dispersion, a high figure of merit, with on the order of 40 dB signal to noise ratio. The invention may be fabricated using standard monolithic processing techniques of types well known in the art. Desirable characteristics such as low cost for large scale production, high reliability and reproducibility, as well as certainty of design parameters, render the present invention a significant improvement over devices of the prior art which attempt to provide comparable signal processing functions.

The foregoing and various other objects, features and advantages of the present invention will become more apparent in the light of the following detailed description of exemplary embodiments thereof, as illustrated in the accompanying drawing.

DETAILED DESCRIPTION

Figure 1:
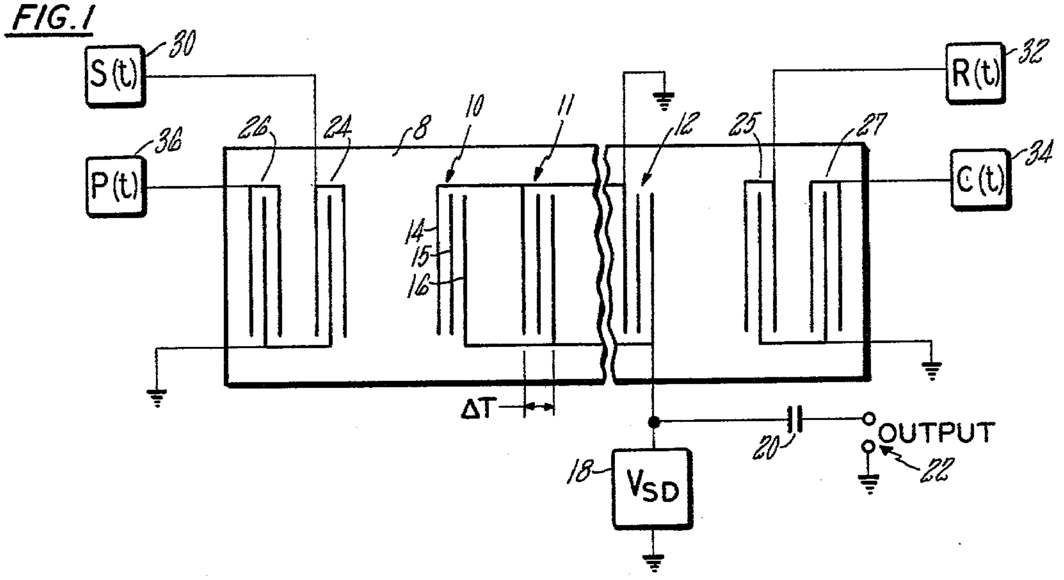
FIG. 1 is a simplified schematic illustration of an exemplary embodiment of the isolated gate, FET SAW signal processor module of the invention.
Figure 2:
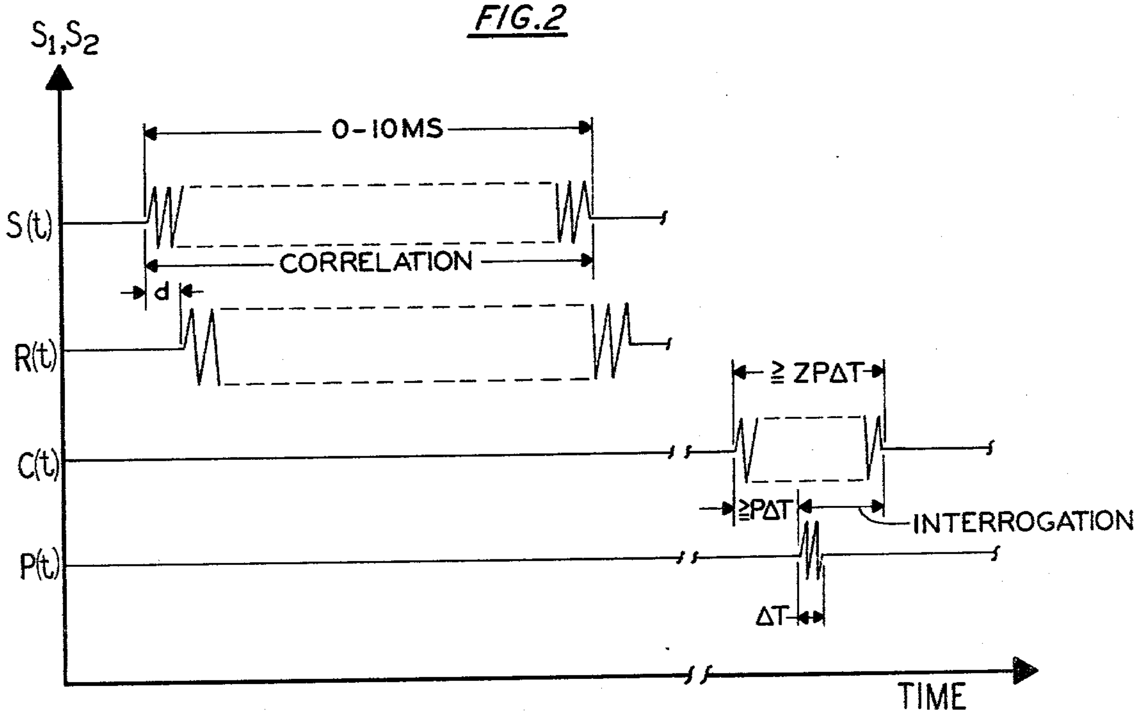
FIG. 2 is a diagram illustrating timing of signals in the use of the invention for long code correlation.

Referring now to FIG. 1, a surface acoustic wave (SAW) module in accordance with the present invention comprises a substrate 8 having semiconductive and piezoelectric properties, such as, for instance an n-type epitaxial layer on a semi-insulating gallium arsenide base. The surface of the module 8 has an isolated plurality (P) of taps 10–12 disposed thereon, each tap including an ohmic source 14, a Schottky barrier gate 15, and an ohmic drain 16. The sources 14 of each of the taps 10–12 are connected together, and to a common potential such as ground. Similarly, the drains 16 of each of the taps 10–12 are interconnected together and to a source-drain bias voltage source 18, as well as through an isolation capacitor 20 to output terminals 22. The module 8 also has a plurality of launching transducers 24–27 formed thereon; formed in accordance with well known interdigital acoustoelectric transducer techniques. The transducer 24 is connected to a suitable source of a coded signal S(t), which may be frequency modulated, phase shift keyed, or phase and/or amplitude keyed. The transducer 25 is connected to a source 32 of a reference wave which has the same frequency and coding as the signal to be correlated (from the source 30). The waves of the sources 30, 32 are launched substantially contemporaneously as is illustrated in FIG. 2 although there may be some slight delay (d) in launching the reference wave depending on any anticipated delay in the reception of the signal. The synchronization of the two waves is not critical in accordance with the invention within the total delay time ($P\Delta T$) of the SAW module 8 since each of a large number of taps 10–12 (which may number in the hundreds) will perform a correlation of any overlapping elements of both waves, the spacing of the taps across the substrate ensuring that a very large number of different relative timings of the two waves will be correlated. If the reception time of the signal is greater than the total delay time ($P\Delta T$), the reference wave may be externally delayed by ($P\Delta T$) time increments until the proper timing is achieved for matching of the signal and reference wave coding to within one such increment ($P\Delta T$) ensuring code chip synchronization at one of the taps.

As is described more fully hereinafter, the source-drain bias on the taps 10–12 will create product mixer action under each of the taps with respect to the signal and reference waves; if the waves have an identical frequency, one of the components of product mixing will be a standing wave which varies across the interaction region (the region between the transducer 24 and 25), but is constant in time. This component represents a DC magnitude of an electric field at any given one of the taps 10–12. As each successive component or chip of the signal wave and the reference wave pass beneath each tap, the DC component will either be in the same sense or in an opposite sense as a function of whether the phase relationships between the signal wave and the reference waves are changing or remain the same. In other words, at a tap in which the components of the signal wave and the reference wave are in phase at all times, the DC components will be successively additive so that a charge will build up on the Schottky barrier gate 15 of the related tap, over the correlation interval.

At taps for which the signal wave and the reference wave are not always in phase, the successive chip components thereof will sometimes provide positive fields and sometimes provide negative fields, so that the charge on the Schottky barrier gate 15 of such related tap will be alternately positive and negative depending on the particular phase coding used, and therefore integrate over the correlation time toward zero. Provided there is at least one tap for each chip of coding of the signal and reference waves, and the reference wave is launched at a time which provides matching of the signal and reference wave coding at one of the P taps, one of the taps will sense the successive chips of coding of the signal wave in proper timed relation with the reference wave and will therefore provide an integrated, correlation output. Note that the correlation step comprises the use of product mixing as a consequence of a field established under each tap by means of the source-drain bias, the stored charge at the isolated gate of each tap being a function of a DC component of product mixing as a consequence of the signal and the carrier having the same frequency, as is described more fully hereinafter.

To interrogate the taps to determine if and when correlation occurred, the transducer 27 is connected to a suitable source 34 of a carrier frequency C(t), and the transducer 26 is connected to a source 36 of an RF pulse P(t) which is launched so as to intercept each tap 10–12 while the taps are responsive to the carrier frequency from the source 34. As illustrated in FIG. 2, the duration of the carrier frequency must be at least twice as great as the total delay time of waves across all of the P taps (2PΔT) and the RF pulse should be of a duration equal to the propagation delay time across a single tap, ΔT. In order to allow the carrier to reach all of the taps before interrogation by the pulse, the pulse should be delayed from launching of the carrier by at least the total propagation delay time across all of the taps, PΔT. During the interrogation step, the pulse and the carrier are nonlinearly product mixed beneath each tap as a consequence of the source-drain bias provided by the source 18 and with respect to each individual tap, also as a consequence of any net stored charge which has been integrated during the correlation interval of the first step. By providing the pulse and carrier at different frequencies, one component of product mixing will be at the sum frequency and one will be at the difference frequency; selection of one or the other by means of a tap configuration definition, as is described hereinafter, will produce an output. The output in this case is taken from each of the drains, which are summed together and coupled via the capacitor 20 to the output terminals 22. The product mixing which occurs will produce an RF modulation on the DC gate-source bias, which in turn provides an RF source-drain current modulation that comprises the desired output. During the readout step, the source-drain bias should be that to provide operation of each tap as a FET with a suitable transfer characteristic to optimize the correlation output which is desired. As is illustrated in FIG. 1, it will in some cases be possible to provide a source-drain bias voltage at the source 18 which is suitable both for provision of the desired mixer efficiency during the correlation step and for provision of the desired FET transfer characteristic for the interrogation step. But as is illustrated with respect to FIG. 2 hereinafter, if different biases are required for correlation and interrogation, it is possible to provide two separate sources which are switched in appropriately during the correlation and interrogation steps, respectively. Since both the correlation and the interrogation steps, employed when using the SAW module of the present invention for long code correlation, utilize nonlinear product mixing, a detailed analysis of the signal processing involved within the module, and the two different ways of exploiting nonlinear product mixing, are described hereinafter. An Appendix of mathematical relationships appears hereinafter in which the signals which are subjected to nonlinear product mixing are referred to generally as $S_1$ and $S_2$; it is to be understood that in the case of the interrogation step, the signal $S_1$ may comprise the coded signal S(t) of the source 30 and the signal $S_2$ may comprise the reference signal R(t) of the source 32. The manner of product mixing in accordance with the invention with respect to providing a stored charge indicative of correlation is first described with respect to $S_1$ and $S_2$. Thereafter, the manner of exploiting product mixing wherein $S_1$ and $S_2$ comprise the pulse and carrier for the interrogation step is carried out.

For any wave propagating in a medium, there is an angular frequency, $\omega$, relating to its oscillatory frequency by $\omega=2\pi f$. Any wave having periodic variation in space within a medium also has what is generally referred to as either a phase constant, a wave number, or a wavevector, k, representative of the phase change of the wave, at any instant in time, per unit distance along the direction of propagation. The wavevector k is dependent upon the characteristics of the medium and is defined by the velocity waves in that medium, as $k=\omega/V$. In surface acoustic waves propagating in an acoustoelectric material, the same holds true. The angular frequency of the strain wave, $\omega$, is a faithful reproduction of the electric frequency applied to the launching transducers to induce the strain wave representative thereof. The propagation of the strain wave, however, is at a velocity, V, determined by the material itself. And, the wavevector, k, is that which relates the phase change per unit distance to the temporal change as a function of the inherent velocity of the strain wave, as determined by the parameters of the acoustoelectric material in which the wave is propagating.

For product mixing of the type exploited in accordance with the present invention, there must be a significant nonlinear parameter related to the mixed waves. During the correlation step, the mixer efficiency is a function of the source-drain bias applied externally to the taps, and is due to interaction between the electric field established under each tap and the parameters of the acoustic waves propagating under the tap.

Referring to the Appendix of mathematical relationships hereinafter, let: $E_m$ represent the mixer effect, such as that due to the electric field, observable at the tap in response to a pair of waves traveling in opposite directions beneath the tap; $S_1$ represent a signal traveling in one direction; $S_2$ represent a signal traveling in the opposite direction; and the subscript "c" denote the combined effect of the two waves. The observable mixer effect requires that relationship (1) hold true. Since the two counter-propagating waves, and their effects, sum linearly in the acoustic substrate, relationships (2)–(4) also apply. The expressions for the counter-propagating waves (as in the embodiment of FIG. 1) are set forth in relationships (5) and (6), wherein the exponential terms represent the wave variations as a function of time and distance, or, stated alternatively, the propagation effects in the waves. The first term of relationship (4) is found by squaring relationship (5) to yield relationship (7), in which the (a) term is observed to contain components at twice the original frequency (second harmonic), and the (b) term is seen to be time and space invariant, and not propagating. Of course, a similar expression can be written for the square of the second wave (relationship (6) squared), which is not written herein for simplicity. The final term of relationship (4), the cross products, is set forth in relationship (8), where the (a) and (b) terms represent components of waves at a frequency which is the sum of the frequencies of the two original waves, and the (c) and (d) terms represent components of waves at a frequency which is the difference between the frequencies of the two original waves.

In accordance with the invention, during the correlation step, the frequency of the reference signal carriers ($R(t)=S_2$) is chosen to be the same as that of the incoming signal ($S(t)=S_1$), so that the sum components of product mixing are at twice the frequency of either of the signals, and the difference frequency is identically zero. Instead, relationship (14) shows that terms (c) and (d) of relationship (8) reduce to those set forth in relationships (15) and (16), which represent standing wave components that are constant in time but vary across the spatial extent of the acoustic medium with periodicity $\Lambda_3=\lambda/2$ where $\lambda=\lambda_1=\lambda_2$ in relationship (13). These are, at any particular tap, DC magnitudes of electric field beneath the tap, which charge the isolated gates of each related tap proportionally. Because these are DC fields having a periodicity of $\lambda/2$, the gate dimension along the direction of propagation of the acoustic wave must be nearly equal to an odd multiple of $\lambda/2$ in order to establish a net charge polarity on the respective gate of a tap. In addition, the tap geometry and intertap spacing need be concerned with the chip rates of amplitude or phase coding of the signals to be correlated, so as to provide adequate resolution to ensure that at least one tap will respond to substantially synchronized chips of the incoming signal and the reference signal. Obviously, with an infinite number of taps, synchronization is assured. On the other hand, other considerations, such as physically practical size limitations, improvement in the correlation-noise ratio, and the need for matching of the tap structure to readout requirements, may dictate certain of the tap structure geometry parameters, as is described more fully hereinafter.

In accordance with the invention, the reference wave ($R(t)=S_2$), having amplitude and/or phase coding as well as carrier frequency selected to match that of the signal to be correlated ($S(t)=S_1$), is launched in timed relation with launching of the signal to be correlated. If there is correlation between the two signals, one of the taps will have significant successive elements of DC components described hereinbefore of the same sense which are therefore additive, and will sum together over the correlation interval. At other taps, the coding of S(t) and R(t) will not match, so that successive DC components of product mixing will be minimal or cancel, depending on the particular coding scheme utilized. This is the first step of the process which causes the fact of correlation to be slowly built up as a stored charge at a particular tap during the correlation time, which may be tens of milliseconds; the relative time delay between the signal and the reference is indicated by the tap at which correlation occurs, which is shown by the timing of the correlation peak at the output.

To read out this information, a second step in the process is required to interrogate the presence and location of a correlation indication which exists as a charge stored at one of the taps. This may be achieved by launching a pulse having a duration on the order of the propagation delay ($\Delta T$) across one tap only of P taps, for mixing with a carrier wave having a duration at least twice as great as the propagation delay time across the entire interaction region of the acoustic medium ($2P\Delta T$). The pulse must be delayed from the initial launching of the carrier by at least one propagation delay ($P\Delta T$) so that the pulse may interact with the carrier at every tap. At this time, bias to the taps should be suitable to cause the RF variation in gate voltage to be at a suitable FET operating level for adequate RF variation in source-drain current as a function of RF gate modulation. The electric field beneath each tap will be established in part by the charge stored in the Schottky barrier element of the tap, and in part by the source-drain bias. If operating parameters result in suitable FET bias solely from the stored charge, the external bias may, in some cases, be zero volts. The mixer efficiency beneath each tap for the nonlinear product mixing between the carrier and the pulse will be a function of the DC charge stored as a consequence of correlation between the signal and the reference in the first step of the process. There will be a much higher mixer efficiency at any tap where the correlation occurs that at any other tap. The RF components of product mixing described with respect to the Appendix hereinbefore (but this time as a consequence of mixing the read-pulse with the read-out carrier signal) will appear on the drain of each tap and may be extracted as an output, each tap output being presented in time sequence with respect to adjacent taps as a consequence of the propagation of the pulse through the medium. The fact of correlation is indicated by a large output at some particular point in time, and the phase relationship between the signal and the reference is indicated by the time of appearance (and therefore the tap) at which correlation is indicated by a large output signal.

To read out the signal, utilization is made of the same mixer effect as is used in correlating the two signals. In this case, however, a pulse is launched against a carrier of a different frequency and the mixing effect is determined at each tap by the stored charge which is indicative of correlation (if any) at such tap. At each tap, the mixing relationships set forth in the Appendix apply, but in this case $S_1$ may be the pulse P(t) used to successively interrogate each of the taps in sequence, and the signal $S_2$ may be the carrier signal C(t). Relationships (1) through (8) apply, the amplitude of mixer efficiency, however, being a function of the stored charge at any one of the taps in addition to any small bias which may be used on all of the taps.

The output will include product mixing components at the sum or difference frequency, depending on tap configuration. Since the pulse and carrier frequencies may be chosen almost arbitrarily, there is a great deal of flexibility in the tap structure design insofar as readout is concerned. However, the signal of interest at the taps is chosen to be at a frequency equal to the sum of the pulse and carrier frequencies, or the difference between the pulse and the carrier frequencies, in dependence upon overall design considerations, as is well known in the art. In order to determine the tap configuration most suitable, the desired output frequency (dictated in part by the pulse and carrier frequencies) and the chip rate of the coding of S(t) may both be taken into account.

Term (a) of relationship (7), contains terms at twice the frequency of the first wave, $S_1=P(t)$, and there are similar components (not shown for simplicity) at twice the frequency of the second wave, $S_2=C(t)$. These relate linearly in both frequency and wavevector so that they are propagating waves. Term (b) of relationship (7) has no temporally or spatially varying components at all, and represents a DC magnitude term, constant across all of the taps. Similarly with respect to the concomitant portion concerning the second wave (not shown for convenience). On the other hand, terms (a) and (b) of relationship (8) have components at the sum frequency but with a wavevector equal to the difference in magnitude between wavevector $k_1$ and $k_2$. Similarly, terms (c) and (d) of relationship (8) have terms at the difference frequency and are related by the sum of the wavevectors. Waves which are traveling in the medium at the velocity of the medium have a wavevector k which is related to the frequency of the wave by the inherent wave velocity of the medium itself, as is described hereinbefore. Thus, waves which are launched into the acoustic medium are traveling waves and do bear the proper relationship. However, waves which are created by interaction of other waves, such as the nonlinear product mixing effect expressed in the relationships of the Appendix, may have a wavevector which is not properly related to the velocity of the medium by the frequency. This is because the wave is created by the interaction of other waves. In such case, the newly created wave may not compose to a traveling wave. Here, the sum or the difference frequency will have a wavevector which is the difference or sum of the wavevectors of the fundamentals, and inherently will not relate to frequency by the velocity of the medium, as is shown in relationships (9) and (10) of the Appendix. Although these waves (as in components (c) and (d) of relationship (8) vary both in time and space, these variations are uncoordinated and any tendency to propagate simply causes the waves to die out rapidly in time and across space. Thus, the desired result of product mixing at either a sum or difference frequency, as chosen, will exist only locally and momentarily as the interrogation pulse passes beneath a given tap; but if there is a significant stored field at that tap, the locally existing generated sum or difference frequency will have an amplitude proportional to the stored charge and can therefore cause a component of the sum or difference frequency to be applied as an RF gate or source-drain modulation. The desired component at the selected sum or difference frequency may be selectively extracted by spacing of the tap elements in proper relationship with the wave-vector of either the sum or the difference frequency, as is desired. The fact that the product frequency (the sum frequency or difference frequency, as selected by the design of the acoustic wave device and selection of frequencies) exists only locally, and varies uniquely from tap to tap, without any significant propagation between taps, provides a useful signal at any one tap of interest, with little intertap interference, reflections and the like. The mixer effect, being local, is inherently isolative, and avoids the necessity for certain intertap isolation networks known in the art.

As described briefly hereinbefore, the result of product mixing of two waves yield many components. The sum frequency component has, as is shown in terms (a) and (b) of relationship (8), a wavevector equal to the difference in the magnitude of the wavevectors associated with the two mixed frequencies, and the difference frequency component has, as illustrated in terms (c) and (d) of relationship (8), a wavevector which is the sum of the magnitudes of the wavevectors of the original, intermixed waves. Selection of either the sum or the difference frequency component is achieved by matching the tap configuration to the wavevector, $k_3$, for the selected component (either the sum frequency or the difference frequency), as shown in relationships (9) and (10).

Propagating waves have a wavelength, $\lambda$, related to the frequency of the wave by the velocity of waves in that medium such that $V=f\lambda$. Even if a wave is not propagating in the medium, there will be a spatial periodicity to the wave, but it is not related to the frequency of the wave by the velocity of the medium, and is instead created by the interaction of the input waves. To emphasize the fact that the result of product mixing produces waves which are not propagating at the volocity of the medium, the spatial periodicity of such waves $\Lambda_3$ is referred to herein as charge periodicity and is defined in relationship (11). By substituting relationships (9) and (10) into relationship (11), it can be seen that the charge periodicity varies directly with frequency as set forth in relatioship (12) and (13), respectively. Therefore, unlike individual waves in which the wavelength is inversely related to the frequency by velocity of the medium, in the present case of product mixing within the surface, as a direct result of wave interaction between two propagating waves (such as the pulse and carrier waves in the read-out example herein), the periodicity $\Lambda_3$ is determined by the interaction of those waves, rather than by propagation of an oscillatory electric wave through a medium having a defining velocity.

To select either the sum or the difference frequency, therefore, one may select either a large or a small tap element spacing commensurate with the charge periodicity $\Lambda_3$ determined from relationships (9) through (13). The choice of whether the device is designed for sum or difference frequency operation depends on several considerations including the relative strength of the two components, the system bandwidth, the capability for filtering out spurious frequency components, and the ease of tap fabrication. For counter-propagating waves (as in the embodiment illustrated in FIG. 1 and the example of the relationships in the Appendix), relationships (12) and (13) illustrate that the spatial tap periodicity for sum frequency operation may be considerably larger than that for difference frequency operation. On the other hand, if the waves are co-propagating (due to the fact that both the incoming signal and the CW carrier are launched from the same end of the SAW device in other embodiments) the signs of the kx terms in relationships (5) and (6) are then all the same, so that the situation is reversed, and the greater tolerance in tap spacing would be achieved by using the difference frequency.

In the example herein, of a correlator for long, amplitude and/or phase coded signals, the tap interaction region geometry is selected so as to be suitable for the chip rate of the signal to be analyzed in the first, correlating step which results from product mixing controlled by the tap nonlinear operation, as well as the wavevector of selected sum or difference frequency, in the second, interrogating step.

For correlation of coded signals, the various taps must be spaced one from another so as to achieve the spacing on the surface related to the spacing of the chips of coding in the signal to be correlated. For instance, if there is a 100 MHz signal carrier, the phase of which is altered every 10 MHz, then the signal would have a 10 MHz sampling rate or sampling frequency. In the substrate, the spacing of the chips of varied phase and/or amplitude is determined by the velocity of the wave in the substrate, V, divided by the chip rate, or: $\Lambda_s = V/f_s$. In order to sample each chip of S(t) contemporaneously with a like chip of R(t), it is necessary to have at least one tap corresponding to each of the code chips, and therefore the intertap spacing $\Gamma \leqq V/2f_s$, the factor of 2 introduced because of the anti-propagation of the waves. In accordance with the invention, when used for correlation, a plurality of correlations are performed, one at each tap, each correlation being a correlation in time (rather than a single correlation in space as in prior art tapped delay line correlators). Since each correlation is totally independent of any other correlation, the plural correlations being provided to avoid the necessity of phase locking of the reference to the incoming signal, there is no need for coherence between the taps. However, the gate length along the wave propagation direction must be of a dimension capable of detecting the DC component of charge produced during correlation, having spatial periodicity $\Lambda_3 = \lambda s/2$ during the correlation step; gate lengths equal to, or nearly equal to, odd multiples of $\lambda s/2$ being acceptable so as to establish a net DC charge on the gate electrode at any tap. The only additional constraint is that the individual tap structures each be dimensioned so as to be sensitive to the sum or difference frequency at readout, depending upon which is chosen, as defined by the pulse and carrier waves during the second, interrogation step. The center-to-center spacing between the gate and the source should be an odd number of half periods of the charge periodicity at the output frequency of interrogation, $L = m\Lambda_3/2$, as determined by relationships (11)-(13). Thus, there must be at least one tap per chip as described hereinbefore (and there may be several taps per chip, since each tap can correlate all of the chips of both the incoming and reference waves during the first correlative step) the tap-to-tap configuration must accommodate the read-out frequency ($\omega_3$) as set forth in relationships (9)-(13).

Figure 3:
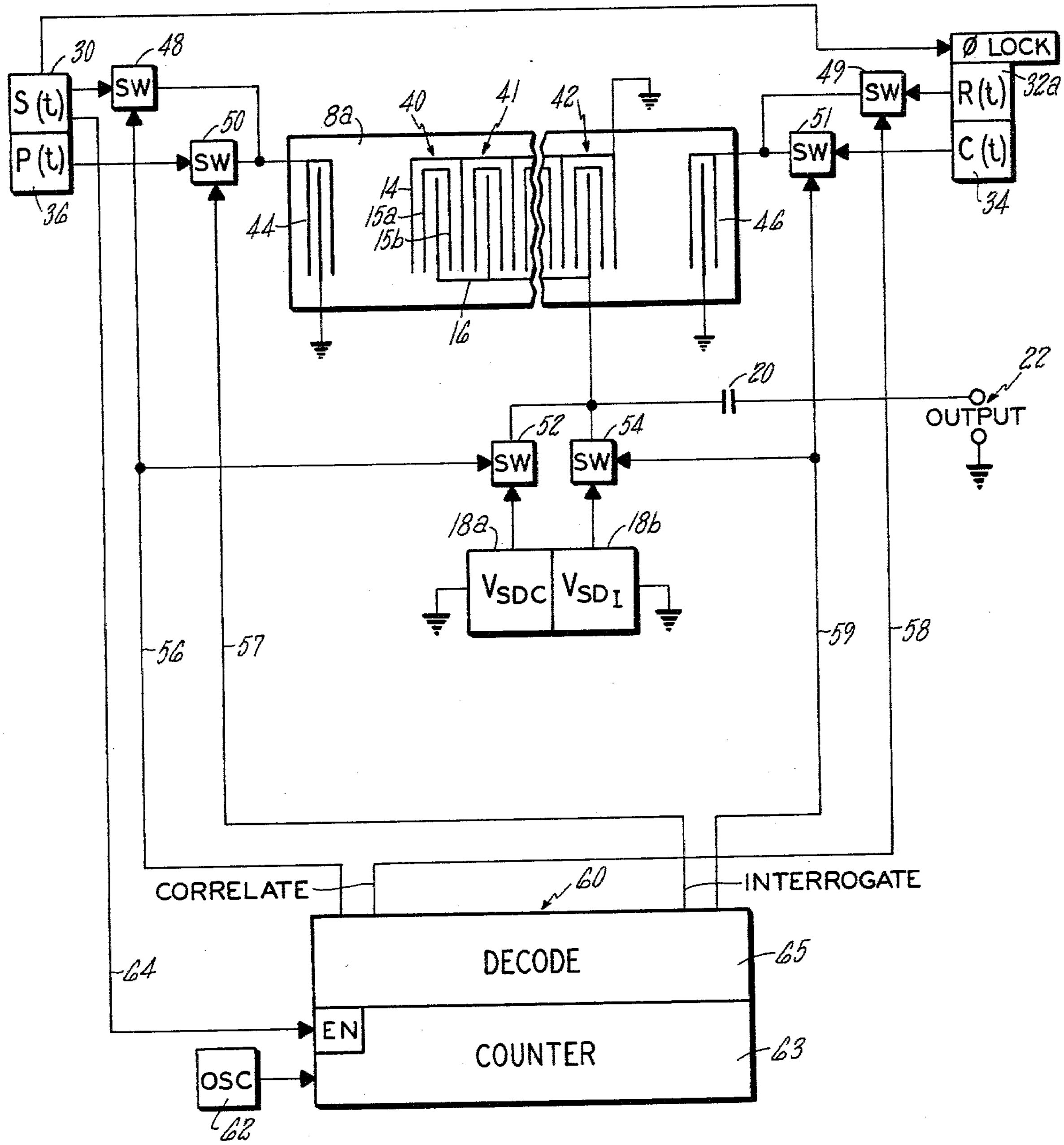
FIG. 3 is a simplified schematic illustration of another embodiment of the invention, having double, isolated gate, back to back FETs and dual purpose launching transducers.

Referring now to FIG. 3, another exemplary embodiment of the invention illustrates several variations which may be made therein. In FIG. 3, the module 8*a* includes a plurality of FET taps 40-42 each of which includes two FETs due to the fact that there are two segments 15*a*, 15*b* of isolated gate interconnected with each other corresponding with each drain segment 16. Since these are connected together, the gate segments 15*a*, 15*b* compose to a single tap; the dimensions of gate segments and spacing between segments being appropriate for net charge summation of the spatially varying DC component having spatial periodicity $\lambda/2$ during the correlation step.

In FIG. 3, only two launching transducers 44, 46 are shown, each being used both for correlation and interrogation. This is achieved by a plurality of switches 48-51 which selectively connect the sources of the signal and the reference during the correlation step, and the switches 50, 51 thereafter connect the pulse and carrier signal for the interrogation step. Additionally, separate bias sources 18*a*, 18*b* may be utilized in the two steps of the process, a switch 51 being used during correlation to connect a source 18*a*, and a switch 54 being used during the interrogation to connect a source 18*b*. The switches 48-54 may be under suitable control of signals on corresponding lines 56-59 which in turn may be responsive to suitable means, such as a digital clock 60. The digital clock 60 may take many forms, such as an oscillator 62 feeding a counter 63 that is enabled by a signal on a line 64 in response to the signal source 30, the output of the counter being fed to a decode circuit 65 so as to provide the signals on the lines 56-59 in a prearranged, timed relationship. The enable signal on the line 64 may, for instance, be provided by the PRG generator in a radar, in a case where correlation of a radar signal is being used for signal-to-noise enhancement. In such case, the signal source 30 may also provide the reference signal, either by phase locking a source 32*a* or directly through a suitable isolation circuit.

The invention is not concerned with the particular layout of the FET taps, which may have four or more gate segments 15 per tap if desired. Also, each gate may be bifurcated (in the manner of double-finger interdigital transducers). Source-drain spacing of an odd number of half wavelength at the output frequency may be used if a variation in output mode is desired. Also, whether the taps are disposed continuously as in FIG. 3 or in an isolated fashion as in FIG. 1 is also immaterial to the invention, and is to be determined by the detail design parameters of any implementation thereof. Similarly, the manner of launching signals for use of the invention is dependent only on the particular utilization to which it is to be put. Common or separate launching transducers may be used as illustrated in FIGS. 1 and 3; the sources which launch signals may relate to long code signal correlation as in the example described hereinbefore. On the other hand, the sources which launch signals may relate to different types of signal processing. It should be understood that the product mixing, integrating, and interrogation functions which are capable of being performed by the module in accordance with the present invention may be utilized for a variety of signal processing applications. And it is anticipated that introduction of this invention into the art will cause evolution of a variety of processes utilizing the SAW module of the invention.

The particular nature of the bias utilized is important only in that there be sufficient bias during the first step (essentially correlating) by means of nonlinear product mixing effective by virtue of the source-drain bias, and having suitable bias, whether it be simply the charge stored on the individual gates or supplemented with additional source-drain bias, to produce the desired source-drain RF current modulation as a consequence of the RF product mixer component modulation of the gate voltage or charge due to the electric field of the product mixing component. So long as isolated gates are provided at each tap, the module of the present invention may be utilized in a wide variety of configurations and applications. The techniques to be utilized in manufacturing a module in accordance with the invention are all well known, since the utilization of FET taps is itself known, although not with the isolated gates of the present invention. For instance, it is known that the ohmic contacts for the source and drain may be formed on n-type gallium arsenide by deposition of gold-germanium, and the Schottky barrier gate electrodes may be formed on n-type gallium arsenide by means of deposition of aluminum. Other materials and techniques are as well known. The gate-source and gate-drain junctions need not be Schottky barriers, but could be p-n junction diodes, as is common in the art; but Schottky barriers are believed to be easiest to use on GaAs. Also, as described briefly hereinbefore, various combinations of semiconductors such as silicon may be utilized in conjunction with suitable piezoelectric coatings such as zinc oxide, to provide the semiconducting and piezoelectric characteristics of the substrate which are required. These techniques are also known in the art. Enhancement of wave launching characteristics of the launching transducers may be achieved in the manner described in Quate and Grudkowski U.S. Pat. No. 3,935,564.

Similarly, although the invention has been shown and described with respect to exemplary embodiments thereof, it should be understood by those skilled in the art that the foregoing and various other changes, omissions and additions may be made therein and thereto, without departing from the spirit and the scope of the invention.

APPENDIX

| | | |
|---|---|---|
| | $E_m \propto S_c^2$ | (1) |
| | $S_c = S_1 + S_2$ | (2) |
| | $S_c^2 = (S_1 + S_2)^2$ | (3) |
| | $S_t^2 = S_1^2 + S_2^2 + 2S_1 S_2$ | (4) |
| | $S_1 = \frac{1}{2}[\hat{S}_1 e^{j(\omega 1t - k1x)} + \hat{S}_1^* e^{-j(\omega 1t - k1x)}]$ | (5) |
| | $S_2 = \frac{1}{2}[\hat{S}_2 e^{j(\omega 2t + k2x)} + \hat{S}_2^* e^{-j(\omega 2t + k2x)}]$ | (6) |
| (a) | $S_1^2 = \frac{1}{4}[\hat{S}_1\hat{S}_2 e^{j(2\omega 1 1 - 2k1x)} + \hat{S}_1^*\hat{S}_1^* e^{-j(2\omega 1t - 2k1x)}$ | (7) |
| (b) | $+ \hat{S}_1\hat{S}_1 + \hat{S}_1^*\hat{S}_1^*]$ | |
| (a) | $2S_1 S_2 = \frac{1}{2}[\hat{S}_1\hat{S}_2 e^{j\{(\omega 1 + \omega 2)t + (k2 - k1)x\}}$ | (8) |
| (b) | $+ \hat{S}_1^*\hat{S}_2^* e^{j\{(\omega 1 + \omega 2)t + (k2 - k1)x\}}$ | |
| (c) | $+ \hat{S}_1\hat{S}_2^* e^{-j\{(\omega 2 - \omega 1)t + (k2 - k1)x\}}$ | |
| (d) | $+ \hat{S}_1^*\hat{S}_2 e^{j\{(\omega 2 - \omega 1)t + (k2 + k1)x\}}]$ | |
| | for sum frequency: $k_3^+ = k_2 - k_1$ | (9) |
| | for difference frequency: $k_3^- = k_2 + k_1$ | (10) |
| | Where $k_1 = V/f_1$; $k_2 = V/f_2$ | |
| | $\Lambda_3 = 2\pi/k_3$ | (11) |
| | $\Lambda_3^+ = \frac{\lambda_1\lambda_2}{\lambda_1 - \lambda_2}$ | (12) |
| | $\Lambda_3^{31} = \frac{\lambda_1\lambda_2}{\lambda_1 + \lambda_2}$ | (13) |
| | $\omega_2 = \omega_1$; $k_2 = k_1 = k$ | (14) |
| | $\hat{S}_1\hat{S}_2^* e^{-j2kx}$ | (15) |
| | $\hat{S}_1^*\hat{S}_2 e^{j2kx}$ | (16) |

Having thus described typical embodiments of our invention, that which we claim as new and desire to secure by Letters Patent is:

1. A surface acoustic wave signal processing module comprising a piezoelectric and semiconductive substrate with means for launching a pair of acoustoelectric waves in said substrate along a propagation path adjacent to a surface of said substrate and a plurality of taps disposed on said surface along said propagation path, each of said taps including at least one drain electrode having an ohmic contact with said substrate, the drain electrodes of all of the taps being connected together, a gate electrode having a rectifying contact with said substrate, the gate electrode of each tap being totally ohmically isolated, and at least one source electrode having an ohmic contact with said substrate, the source electrodes of all the taps being connected together.

2. In a method of correlating amplitude and/or phase coded signals by means employing a surface acoustic wave module in which the temporal extent of the coded waves is much greater than the propagation delay time of the surface acoustic wave module, the steps of:

launching a pair of waves into a surface acoustic wave module comprising a piezoelectric and semiconductive substrate having a plurality of taps disposed on the surface along a propagation path between wave launching transducers, each of said taps including at least one drain electrode having an ohmic contact with said substrate, the drain electrodes of all of the taps being connected together, a gate electrode having a rectifying contact with said substrate, the gate electrode of each tap being totally ohmically isolated, and at least one source electrode having an ohmic contact with said substrate, the source electrodes of all the taps being connected together, said wave being launched in relation with each other so as to achieve coincidence of like coding at one tap within said substrate, one of said waves being a signal to be correlated with the other of said waves which comprises a reference wave having the desired coding and the same frequency as the signal to be correlated;

biasing said taps by providing a bias voltage between said common sources and said common drains, said bias voltage being applied during the time that said waves are interacting in said module, said bias voltage being such as will provide an electric field beneath each of the taps to induce a significant amount of nonlinear product mixing of said waves, one of the components of which is a standing wave, consisting of a steady state electric field at each tap corresponding with each component of the waves being correlated, such that only a tap having components of both waves thereat continuously in code coincidence as the two waves pass beneath said tap are additive;

after the two launched signal and reference waves have subsided in said substrate, launching a carrier wave in said substrate at a first frequency, and thereafter launching an RF pulse in said substrate at a second frequency, said pulse having a duration substantially related to the propagation delay of waves across a single tap of said substrate, said carrier wave having a duration at least twice as great as the total propagation delay of waves through said substrate, said pulse being launched in timed relationship with said carrier wave so that said pulse will mix with said carrier wave at substantially all of said taps with mixing strength at any of the taps determined by the charge buildup occurring during said launching and biasing steps; and extracting from all of said common sources and drains a signal which indicates the mixer efficiency at each of said taps by the amplitude of such signal at a third frequency which is selected from the sum and difference of the frequencies of said carrier and said pulse.

* * * * *

UNITED STATES PATENT AND TRADEMARK OFFICE
CERTIFICATE OF CORRECTION

PATENT NO. : 4,247,903

DATED : January 27, 1981

INVENTOR(S) : Thomas W. Grudkowski; Thomas M. Reeder

It is certified that error appears in the above—identified patent and that said Letters Patent is hereby corrected as shown below:

Column 4, line 12 "an isolated" should read -- a --

Column 4, line 14 "a" should read -- an isolated --

Signed and Sealed this

*Third* Day of *November 1981*

[SEAL]

*Attest:*

GERALD J. MOSSINGHOFF

*Attesting Officer* *Commissioner of Patents and Trademarks*